United States Patent [19]
Doi et al.

[11] 3,902,951
[45] Sept. 2, 1975

[54] COPPER-CLAD LAMINATE AND PRODUCTION THEREOF

[75] Inventors: Kazuo Doi, Osaka; Takeru Murakami, Neyagawa; Hiroyoshi Sato, Shijonawate; Hiroshi Ishii, Neyagawa, all of Japan

[73] Assignee: Matsushita Electric Works, Ltd., Kadoma, Japan

[22] Filed: Sept. 25, 1973

[21] Appl. No.: 400,616

Related U.S. Application Data

[63] Continuation of Ser. No. 101,067, Dec. 23, 1970, abandoned.

[30] Foreign Application Priority Data

| | | |
|---|---|---|
| Dec. 28, 1969 | Japan | 45-952 |
| Dec. 28, 1969 | Japan | 45-953 |
| Dec. 28, 1969 | Japan | 45-954 |
| Dec. 28, 1969 | Japan | 45-955 |

[52] U.S. Cl. ................ 156/313; 156/330; 156/331; 156/332; 161/185; 161/186; 161/195; 161/DIG. 7

[51] Int. Cl. .... C09j 7/00; B32b 17/10; B32b 27/38

[58] Field of Search .......... 156/310, 313, 330, 332, 156/331; 161/185, 186, 188, 195, 233, DIG. 7

[56] References Cited

UNITED STATES PATENTS

| | | | |
|---|---|---|---|
| 3,388,036 | 6/1968 | Alampi | 161/185 |
| 3,527,665 | 9/1970 | Wright et al. | 161/92 |
| 3,556,928 | 1/1971 | Zolg | 161/186 |
| 3,756,891 | 9/1973 | Ryan | 156/309 |

*Primary Examiner*—Charles E. Van Horn
*Assistant Examiner*—Robert A. Dawson
*Attorney, Agent, or Firm*—Wenderoth, Lind & Ponack

[57] ABSTRACT

Method of preparing a copper-clad laminate by impregnating a base material with a varnish of a thermosetting resin, drying the base material, adhering a copper foil to the base material through an adhesive containing a curable epoxy resin and a specific type of curing agent, for example, a compound having amino and allyl radicals, and heating the assembly under pressure.

7 Claims, 1 Drawing Figure

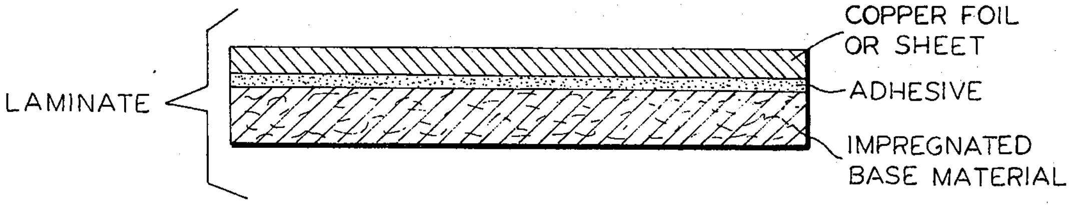
INVENTORS
KAZUO DOI
TAKERU MURAKAMI
HIROYOSHI SATO
HIROSHI ISHII
BY Wenderoth, Lind & Ponack
ATTORNEYS

COPPER-CLAD LAMINATE AND PRODUCTION THEREOF

This is a continuation of application Ser. No. 101,067, filed Dec. 23, 1970, now abandoned.

This invention relates to a copper-clad laminate and to a method for making the same.

As is well known in the art a copper-clad laminate or a laminate having a copper foil or sheet as the surface layer is useful for making various electrical and electronic components, particularly printed circuits.

It is generally known to make such a copper-clad laminate by impregnating a base or substrate with a thermosetting or curable resin composition, placing a copper foil or sheet on the surface of the base and heating the assembly under pressure to make a unitary laminate. For such thermosetting or curable resin there has been proposed to use a polymerizable prepolymer or precondensate of unsaturated polyester or polydiallylphthalate resins. In the case of the use of unsaturated resin prepolymer a cross-linking agent is also incorporated in the resin composition. However, since such cross-linking agent is liquid, the resin composition is liquid and tacky at the normal temperature. Therefore, when the composition is impregnated into the base, the surface, prior to curing, is tacky even in the dried state so that it is troublesome in handling and storing. Further, while unsaturated polyester resins have electrical characteristics comparable with epoxy resins, they are not satisfactory in adhesion to a copper foil. Diallylphthalate resin prepolymer is not tacky and therefore a base impregnated therewith is not tacky at the room or normal temperature and is easy to handle and store. However, again, diallylphthalate resins are poor in adhesion to copper foil or sheet. Thus, in any case, conventional copper-clad laminates have drawbacks in that the surface copper layer tends to delaminate from the base or substrate.

Therefore, it is a principal object of this invention to provide a copper-clad laminate wherein the surface copper foil is firmly bonded to the base or substrate.

Another object of this invention is to provide an improved method for making a copper-clad laminate wherein the surface copper foil is firmly bonded to the base or substrate.

Other objects, features and advantages of this invention will be apparent from the following description.

Briefly, this invention provides a method for making a copper-clad laminate which comprises impregnating a base with a varnish of a thermosetting resinous material selected from the group consisting of prepolymers of unsaturated polyesters and prepolymers of polydiallylphthalates, drying the impregnated base, placing a copper foil on the surface of the base through a layer of a thermosetting adhesive comprising (1) a curable epoxy resin and (2) a compound selected from the group consisting of (a) compounds having at least one amino or imino radical and at least one allyl or vinyl radical and (b) aromatic polycarboxylic acids partially esterified with an unsaturated compound having at least one allyl, substituted allyl, vinyl or substituted vinyl radical, and then heating the laminated assembly under pressure to make a unitary structure.

In carrying out the method of this invention, any suitable inorganic or organic sheet material known in the art of laminates of this kind may be used. Examples of such base or substrate material are glass cloth, glass mat, asbestos sheet, synthetic fabrics, synthetic fiber mat, paper sheet, cotton cloth, etc.

According to the invention such base material is impregnated with a solution or varnish of a thermosetting resinous material which is a prepolymer or precondensate of unsaturated polyester polymers or polydiallylphthalate polymers. In any case the polymerizable (or polycondensable) prepolymers should be solid at normal temperature or have a melting point higher than 40°C.

Such unsaturated polyester prepolymers are well known in the art. Generally, they are prepared by the polycondensation, under heating, of $\alpha,\beta$-unsaturated dicarboxylic acids such as maleic anhydride, fumaric acid, etc. with glycols such as ethylene glycol, propylene glycol, butane diol, neopentyl glycol, diethylene glycol, xylylene glycol, hydrogenated bispenol A, etc. In this case, if desired, a part of the dicarboxylic acid may be replaced by a saturated dicarboxylic acid such as phthalic anhydride, isophthalic acid, terephthalic acid, tetrachloro-phthalic anhydride, tetrabromophthalic anhydride, HET acid, succinic acid, adipic acid, etc. Preferably, the acid component and glycol component are polycondensed in a molar ratio of about 1:1. Since these unsaturated polyester prepolymers or precondensates and their preparation are so well known in the art as thermosetting or curable resin materials, no further explanation would be required thereabout. In any case, however the unsaturated polyester prepolymers should have a softening or melting point higher than 40°C. Further it is preferable that the prepolymers have an acid value of from 15 to 40.

Diallylphthalate prepolymers to be used in this invention are also well known in the art as thermosetting or curable resin materials (diallylphthalate prepolymers of phthalic acid, isophthalic acid, terephthalic acid, halogenated phthalic acid, etc.) which are solid or have a softening or melting point higher than 40°C., and therefore no detailed explanation thereabout would be required here. Preferably, the diallylphthalate prepolymers should have a molecular weight of from 8,000 to 25,000.

It is also possible to employ a mixture of two or more different polyester prepolymers or a mixture of such polyester prepolymer and diallylphthalate prepolymer.

In order to enable the impregnation of the curable or thermosetting resinous material to the base material, the resinous material is used in the form of a solution or varnish. For this purpose any suitable organic solvent capable of dissolving such resinous material may be used. Examples of such solvents are ketones (e.g. acetone, methyl ethyl ketone, etc.), esters (e.g. methyl acetate, ethyl acetate, etc.) and aromatic hydrocarbons (e.g. benzene, toluene, xylene, etc.).

The solid content in such solution or varnish is not critical as long as the varnish can readily be impregnated into the base material.

When unsaturated polyester prepolymer is used it is necessary to use a cross-linking agent or curing agent, which is also added to the above resinous solution or varnish. Such cross-linking agent should also be solid at the normal temperature or have a softening or melting point higher than 40°C. Examples of useful cross-linking agents are vinyl-p-phenylbenzoate (m.p. 51°C.), N-vinylcarbazole (m.p. 67°C.), allyl urea (m.p. 84°C.), acrylamide (m.p. 84°C.), phenyl maleimide (m.p. 90°C.), acenaphthylene (m.p. 92°C.), maleimide (m.p. 93°C.), diallylphthalate prepolymer (m.p. 80°–90°C.), etc. It is also possible to employ an isocyanuric acid represented by the following general formula:

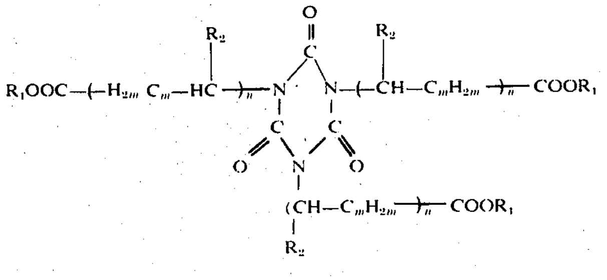

wherein $R_1$ represents allyl group, $R_2$ represents hydrogen, methyl or ethyl, $m$ is an integer from 0 to 2 inclusive, $n$ is an integer from 0 to 1 inclusive, and the number of carbon atoms between each N atom and the corresponding —$COOR_1$ group is not higher than 3.

More particular examples of such isocyanuric acid are as follows:

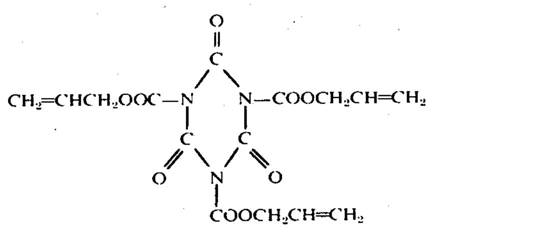

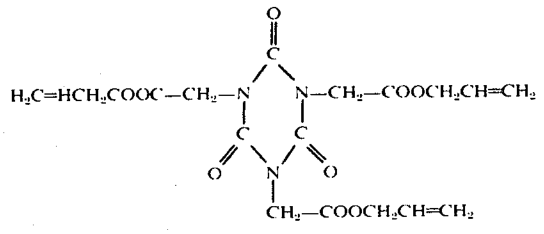

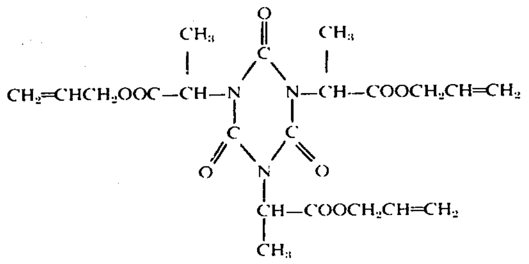

The isocyanuric acid derivatives or allyl compounds of the above formulae may be prepared, for example, by reacting an allyl or substituted allyl ester of a monohalogenolower alkyl carboxylic acid, such as allyl chloroformate ($CH_2 = CH - CH_2OCOCl$), monohalogenated allyl acetate or monohalogenated allyl propionate, with an alkali metal salt of isocyanuric acid in a non-protonic solvent with a high dipolar moment such as N,N-di-lower alkyl formamide, N,N-di-lower alkyl acetamide.

The amount of such cross-linking agent may vary over a wide range such as 5–70 parts by weight based on 100 parts of the unsaturated polyester prepolymer.

Thus, when unsaturated polyester prepolymer is used the resin solution or varnish contains the above mentioned cross-linking agent.

In any case, the diallylphthalate prepolymer or polyester prepolymer solution also contains an initiator. Any conventional initiator known in the art of polycondensation of unsaturated polyester prepolymers or diallylphthalate prepolymers may be used. Examples of such radical polymerization initiators are organic peroxides, organic peresters, organic azo compounds, etc. such as benzyl peroxide, t-butylperoxybenzoate, hydroperoxide, di-t-butyl oxide, di-t-butylperbenzoate, dicumylperoxide, etc. Such initiator may be used in an amount of 0.4 to 5 parts by weight per 100 parts of the prepolymer.

If desired, the prepolymer solution or varnish may further contain an additive (filler and/or pigment) such as calcium carbonate, alumina, clay, kaolin, titanium oxide, silica, antimony trioxide, red oxide, phthalocyanine blue, iron black, etc. The amount of such additive is not critical and may vary over a wide range depending upon the particular use so far as the resulting resinous varnish can effectively be impregnated to the base material.

The base material is impregnated with the varnish in a usual well known manner and then dried to remove the solvent. It is preferable to promote the drying by heating the impregnated base material at a proper temperature up to about 130°C.

Since all the ingredients contained in the varnish are solid and not adhesive or tacky at the room or normal temperature below 40°C. the dried base material is not tacky which facilitates handling, storing and transportation thereof.

According to the invention, a copper foil or sheet is then placed on the surface of such dried base material with an adhesive therebetween. An important feature of this invention is in the use of a novel and improved adhesive, which will be explained in detail hereinafter.

According to the invention, the adhesive comprises a solution or varnish of a curable epoxy resin and a curing agent therefor. Any commercial curable epoxy resin for the adhesive may be used. Such epoxy resins are well known in the art and are commercially available under various trade marks including EPON, EPIKOTE, DOW, ARALDITE, SCOTCHCAST, etc. Therefore, no further explanation will be required for epoxy resins to be used in this invention.

According to the invention, the curing agent for epoxy resins is selected from the group consisting of (a) compounds having at least one amino or imino radical and at least one allyl or vinyl radical and (b) aromatic polycarboxylic acids partially esterified with an unsaturated compound having at least one allyl, substituted allyl, vinyl or substituted vinyl radical.

Examples of the compounds (a) are as follows:

[I] $CH_2=CH-CH_2NH_2$

[II] $CH_2=C(CH_3)-CH_2NH_2$

[III] $CH_2=CHCH_2CONH_2$

[IV] $\begin{matrix}CH-CO \\ \| \\ CH-CO\end{matrix}\!\!>NH$

[V]
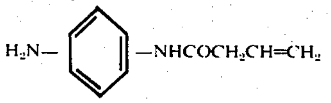

[VI]
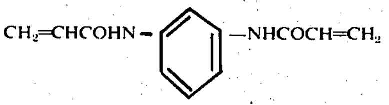

[VII]
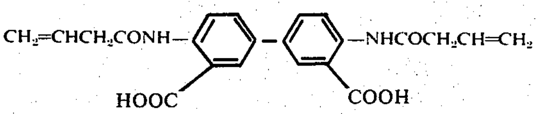

Other examples of the compounds (a) are acrylamide, diallylamine, xylylene diamine, acrylic or methacrylic amide of xylylene diamine, etc.

Examples of the compounds (b) are as follows:

(A)
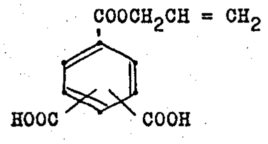

(B)
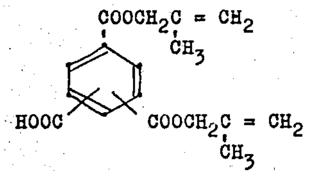

(C)
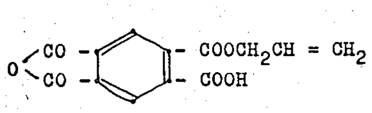

(D)
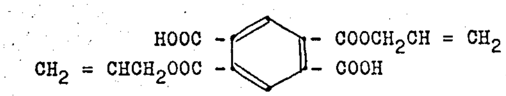

(E)
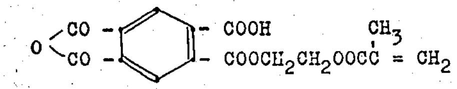

(F)
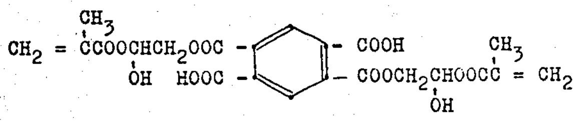

Allyl ester of phthalic acid may also be used as the compound (b).

It will be noted that each compound (b) has at least one carboxyl group.

The above curing agent (a) or (b) may be used in an amount of 5–40 parts by weight per 100 parts of the epoxy resin.

The epoxy resin with curing agent is used in the form of a solution or varnish. Thus, the curable epoxy resin and the curing agent (a) or (b) are dissolved in a suitable organic solvent such as acetone, methyl ethyl ketone, dimethylformamide or other solvents such as those mentioned before, in the preparation of the resin varnish to be impregnated into the base material. The concentration (solid content) of such varnish or solution is not critical as long as it can readily be impregnated into fibrous material or coated on a copper foil as explained below. Generally, the solvent is used in an amount of 70–200 parts by weight per 100 parts of the epoxy resin.

The epoxy resin with its curing agent may be applied between the resin-impregnated base material and copper foil or sheet in any suitable manner. Thus, for example, the above mentioned varnish of epoxy resin with curing agent (a) or (b) may be applied in a thin layer on a copper foil and the coated copper foil is dried to remove the solvent to obtain a copper foil with an adhesive layer thereon. Then the foil with an adhesive layer thereon, is placed on the resin-impregnated base material in such a manner that the adhesive layer would be in contact with the base material. Alternatively, the above mentioned varnish of epoxy resin with the curing agent (a) or (b) is impregnated into a fibrous sheet material which may be similar to or the same as that used for the base material. The impregnated sheet is dried to remove the solvent to prepare a dried sheet containing the epoxy resin and curing agent therefor. This is sometimes referred to as "prepreg". Then a copper foil is placed on the surface of the resin-impregnated base material with the above prepared epoxy-impregnated sheet therebetween.

If desired a plurality of the resin-impregnated base sheets are stacked in order to obtain a desired thickness.

The copper foil or sheet may be any one known in the preparation of copper-clad laminates for electrical or electronic uses. Such copper foil or sheet is commercially easily available.

The assembly composed of the base material sheet(s), epoxy resin adhesive layer and copper foil top layer is then press-heated. Thus, for example, the assembly is clamped between hot press-plates and heated under pressure. Generally, the assembly is heated at a temperature of about 130°–180°C. under a pressure of 20–150 kg./cm.$^2$ for 20–90 minutes to obtain a unitary laminate structure clad with a copper foil on the surface.

During the above heat treatment the epoxy resin is cured by the action of the amino or imino radical of the curing agent (a) or by the action of the carboxyl radical of the curing agent (b) so that there is obtained a firm bonding with the copper foil. On the other hand, the allyl or vinyl radical in the curing agent (a) or (b) reacts with the unsaturated polyester or diallylphthalate resin in the base material. As a total result, therefore, there is accomplished a firm bonding between the base sheet and copper foil. Of course, during the above heat treatment the unsaturated polyester or diallylphthalate resin is also cured.

Therefore, according to the invention there is obtained a copper-clad unitary laminate structure having a high peeling strength. Further the laminate of this invention also possesses excellent solder-resistance and various electrical properties.

The invention will be further explained by means of the following Examples.

EXAMPLE 1

2 mols of isophthalic acid and 3.15 mols of propylene glycol were reacted at 180° to 220°C. in a carbon dioxide gas current to obtain a product having an acid value of 8.8. Then 90 mg. of hydroquinone and 1 mol of maleic anhydride were added thereto to further react at 180° to 235°C. to obtain an unsaturated polyester (A) having an acid value of 27.6 and a melting point of 76° to 80°C.

A glass cloth (0.18 mm. thick, 205 g./m.$^2$) was dipped in and impregnated with a resin varnish consisting of 80 parts by weight of the above prepared unsaturated polyester, 20 parts by weight of a diallyl phthalate prepolymer (melting point 80°C.), 1.2 parts by weight of tert-butyl perbenzoate, 20 parts by weight of methyl ethyl ketone and 60 parts by weight of toluene. The impregnated cloth was then dried at 90°C. for 10 minutes and at 128°C. for 6 minutes to obtain a non-sticky prepreg having a resin content of 42 % by weight.

On the other hand, a copper foil (thickness 35 microns) was spray-coated with a resin varnish consisting of 100 parts by weight of an epoxy resin (Araldite 6071) 22 parts by weight of the above mentioned curing agent (II) and 100 parts by weight of acetone and was dried at 70°C. for 15 minutes and at 120°C. for 5 minutes to obtain a copper foil with an adhesive layer thereon having an average thickness of 38 microns.

Then, eight sheets of the above mentioned prepregs and one copper foil with the adhesive layer were stacked and the assembly was heated at 160°C., under a pressure of 50 kg./cm.$^2$ for 60 minutes to obtain a unitary copper-clad laminate Table 1.

Table 1

| Item | | Treatment | Example 1 |
|---|---|---|---|
| Solder resistance (260°C. 30 sec.) | | A | No change |
| Peeling strength (kg./cm.) | Normal | A | 1.6 |
| | Treated | | 1.6 |
| Volume resistivity (Ω - cm.) | Normal | C-90/20/65 | $7 \times 10^{13}$ |
| | Treated | C-90/20/65 + C-96/40/90 | $2 \times 10^{13}$ |
| Adhesive surface resistance (Ω) | Normal | C-90/20/65 | $2 \times 10^{13}$ |
| | Treated | C-90/20/65 + C-96/40/90 | $2 \times 10^{11}$ |
| Laminate surface resistance (Ω) | Normal | C-90/20/65 | $5 \times 10^{13}$ |
| | Treated | C-90/20/65 + C-96/40/90 | $2 \times 10^{11}$ |
| Insulation (Ω) | Normal | C-90/20/65 | $3 \times 10^{13}$ |
| | Treated | C-90/20/65 + D-2/100 | $2 \times 10^{10}$ |
| Dielectric constant (IMH$_z$) | Normal | C-90/20/65 | 4.3 |
| | Treated | C-90/20/65 + D-48/590 | 4.5 |
| Dielectric dissipation factor (IMH$_z$) | Normal | C-90/20/65 | 0.011 |
| | Treated | C-90/20/65 × D-48/50 | 0.015 |
| Triclene resistance | | A | No change |

Triclene is a registered Trademark for trichloroethylene.

The above characteristics were measured by the testing methods specified under JIS C6484.

For comparison a one-surface copper-clad laminate was prepared in the same manner as above except that a commercial epoxy adhesive for metal bonding was utilized. This laminate was blistered when the solder-resistance test was conducted at 260°C. for 15 seconds and therefore its peeling strength after the soldering could not be measured.

EXAMPLE 2

1.2 mols of maleic anhydride, 0.8 mol of HET acid (Trade Mark of Hooker Chemical Company), 2.1 mols of propylene glycol and 85 mg. of hydroquinone were reacted for polycondensation to obtain an unsaturated polyester having an acid value of 20.9 and a melting point of 73° to 76°C.

A glass mat (310 g./m.$^2$) was sprinkled with a resin varnish consisting of 94 parts by weight of the above prepared unsaturated polyester, 6 parts by weight of a compound (m.p. 78°C.) of the formula:

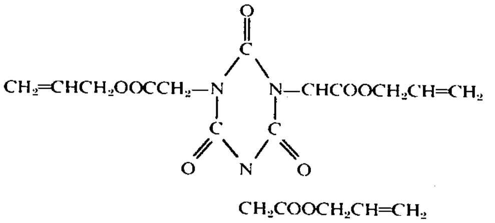

, 1 part by weight of tert-butyl perbenzoate, 30 parts by weight of acetone and 70 parts by weight of toluene. The impregnated glass mat was dried at 80°C. for 30 minutes and then at 120°C. for 15 minutes to obtain a prepreg (E) having a resin content of 63% by weight.

On the other hand, a glass cloth (95 g./m.$^2$ and 0.1 mm. thick) was impregnated with a resin varnish consisting of 100 parts by weight of an epoxy resin (Araldite 6071), 22 parts by weight of the curing agent of the formula [III] and 100 parts by weight of acetone and wad dried at 70° to 120°C. for 15 minutes to obtain a prepreg (F) of a resin content of 60 % by weight.

Then, two sheets of the above mentioned prepregs (E) were laminated and on each side one copper foil (35 microns thick) was placed through a layer of the prepreg (F). The assembly was heated at 170°C. under a pressure of 100 kg./cm.$^2$ for 90 minutes to obtain a unitary laminate clad with copper on both surfaces. The characteristics of the resulting laminate are as indicated in Table 2.

For comparison, there are also indicated in Table 2 the characteristics of a both-surface copper-clad laminate obtained in the same manner except that the prepreg (F) was not used.

Table 2

| Item | | Example 2 | Control |
|---|---|---|---|
| Solder resistance (260°C., 30 sec.) | | No change | No change |
| Peeling strength (kg./cm. | Normal | 1.5 | 1.6 |
| | Solder treated | 1.5 | 1.6 |
| Insulation resistance (Ω) | Normal | $6 \times 10^{13}$ | $7 \times 10^{13}$ |
| | Treated | $3 \times 10^{10}$ | $2 \times 10^{10}$ |
| Dielectric constant (IMH$_z$) | Normal | 4.0 | 4.9 |
| | Treated | 4.2 | 5.1 |
| Dielectric dissipation factor (IMH$_z$) | Normal | 0.011 | 0.021 |
| | Treated | 0.015 | 0.027 |
| Inflammability ASTM D635 | | Self-extinguished in 5 sec. | Self-extinguished in 5 sec. |

The above characteristics were measured by the testing methods specified under JIS C6484.

Further, a both-surface copper-clad laminate obtained in the same manner except that a commercial epoxy resin prepreg (glass cloth base material and resin content 58 % by weight) instead of the prepreg (F) in Example 2 had a peeling strength of 1.5 kg./cm.$^2$ in the normal state and blistered when the solder-resistance test was conducted at 260°C. for 20 seconds, with the result that there occurred delamination between the epoxy resin layer and the unsaturated polyester resin layer.

EXAMPLE 3

0.5 mol of isophthalic acid, 0.5 mol of phthalic anhydride, 1.1 mols of propylene glycol and 1.0 mol of ethylene glycol were reacted until the acid value of the product became 9.3. Then the polycondensation reaction was further continued by adding 1 mol of maleic anhydride and 80 mg. of hydroquinone to obtain an unsaturated polyester having an acid value of 26.1 and a melting point of 59° to 63°C.

A paper sheet (thickness 8 mils) was dipped in and impregnated with a resin varnish consisting of 95 parts by weight of the above prepared unsaturated polyester, 5 parts by weight of acrylamide, 0.8 part by weight of tert-butyl perbenzoate, 0.2 part by weight of benzoyl peroxide and 100 parts by weight of acetone. The impregnated paper sheet was dried at 100° to 120°C. for 10 minutes to obtain a prepreg having a resin content of 52 % by weight.

On the other hand, a copper foil (thickness 35 microns) was spray-coated with a resin varnish consisting of 85 parts by weight of an epoxy resin (Araldite 6071), 15 parts by weight of another epoxy resin (Araldite GY-250), 30 parts by weight of the curing agent [VI] and 200 parts by weight of methyl ethyl ketone. The coated copper foil was dried at 80° to 120°C. for 18 minutes to obtain a copper foil with an adhesive layer of an average thickness of 60 microns.

Then, nine sheets of the above prepared prepregs and one copper foil were stacked and the assembly was heated at 155°C. under a pressure of 120 kg./cm.$^2$ for 90 minutes to obtain a laminate clad with copper foil on one surface.

There was observed no change in the solder-resistance test (at 260°C. for 10 seconds) and the peeling strength after the soldering was 1.5 kg./cm.$^2$

EXAMPLE 4

A glass cloth (205 g./m.$^2$, 0.18 mm. thick) was impregnated with a resin varnish consisting of 70 parts by weight of the unsaturated polyester of Example 3, 30 parts by weight of a diallyl phthalate polymer (melting point 80°C.), 1 part by weight of tert-butyl perbenzoate, 50 parts by weight of toluene and 50 parts by weight of methyl ethyl ketone. The impregnated cloth was dried at 80°C. for 10 minutes and at 125°C. for 10 minutes to obtain a prepreg (G) having a resin content of 39 % by weight.

On the other hand, a glass cloth (0.1 mm. thick, 95 g./m.$^2$) was dipped in a resin varnish consisting of 90 parts by weight of an epoxy resin (Dow 511), 10 parts by weight of another epoxy resin (Araldite 6071), 32 parts by weight of the above indicated curing agent [IV] and 110 parts by weight of methyl ethyl ketone. The impregnated cloth was dried at 120° to 130°C. for 15 minutes to obtain a prepreg (H) having a resin content of 56 % by weight.

Then six sheets of the above prepared prepregs (G) and one prepreg (H) were laminated and further a copper foil (thickness 35 microns) was placed thereon. The assembly was heated at 175°C. under a pressure of 90 kg./cm.$^2$ for 90 minutes to obtain a unitary laminate clad with copper on one surface. The characteristics of the copper-clad laminate thus prepared are as shown in Table 3.

For comparison there are also indicated in Table 3 the characteristics of a one-surface copper-clad laminate obtained in the same manner as above except that the prepreg (H) was not used.

Table 3

| Item | | Example 4 | Control |
|---|---|---|---|
| Solder resistance (260°C., 20 sec.) | | No change | Blistered |
| Peeling strength (kg./cm.) | Normal | 1.5 | 1.0 |
| | Solder treated | 1.5 | <0.5 |
| Dielectric constant ($IMH_z$) | Normal | 4.3 | 4.2 |
| | Treated | 4.4 | 4.4 |
| Dielectric dissipation factor ($IMH_z$) | Normal | 0.011 | 0.010 |
| | Treated | 0.015 | 0.015 |

EXAMPLE 5

A glass cloth (200 kg./m.², 0.18 mm. thick) was dipped in and impregnated with varnish consisting of 100 parts by weight of a diallyl phthalate prepolymer, 1.5 parts by weight of tert-butyl perbenzoate and 100 parts by weight of methyl ethyl ketone. The impregnated cloth was dried at 90°C. for 10 minutes and at 130°C. for 5 minutes to obtain a prepreg (I) having a resin content of 44 % by weight.

On the other hand, a glass cloth (100 g./m.², 0.1 mm. thick) was dipped in and impregnated with a varnish consisting of 100 parts by weight of an epoxy resin (Araldite 6071), 22 parts by weight of a curing agent of the formula III and 100 parts by weight of acetone. The impregnated cloth was then dried at 80° to 120°C. for 15 minutes to obtain a prepreg (J) having a resin content of 60 % by weight.

Then eight sheets of the above prepared prepreg (I), one sheet of the prepregs (J) and a copper foil were stacked in the mentioned order and the assembly was heated at 165°C. under a pressure of 70 kg./cm.² for 60 minutes to obtain a laminate clad with copper on one surface and having such characteristics as shown in Table 4.

Table 4

| Item | | Treatment | Example 5 |
|---|---|---|---|
| Solder resistance (260°C. 30 sec.) | | A | No change |
| Peeling strength (kg./cm.) | Normal | A | 1.6 |
| | Treated | | 1.6 |
| Volume resistivity (Ω - cm.) | Normal | C-90/20/65 | $4 \times 10^{13}$ |
| | Treated | C-90/20/65 + C-96/40/90 | $2 \times 10^{13}$ |
| Adhesive surface resistance (Ω) | Normal | C-90/20/65 | $2 \times 10^{13}$ |
| | Treated | C-90/20/65 + C-96/40/90 | $2 \times 10^{11}$ |
| Laminate surface resistance (Ω) | Normal | C-90/20/65 | $4 \times 10^{13}$ |
| | Treated | C-90/20/65 + C-90/40/90 | $3 \times 10^{11}$ |
| Insulation resistance | Normal | C-90/20/65 | $4 \times 10^{13}$ |

Table 4-Continued

| Item | | Treatment | Example 5 |
|---|---|---|---|
| (Ω) | Treated | C-90/20/65 + D-2/100 | $3 \times 10^{10}$ |
| Dielectric constant ($IMH_z$) | Normal | C-90/20/65 | 4.4 |
| | Treated | C-90/20/65 + D-48/590 | 4.5 |
| Dielectric dissipation factor ($IMH_z$) | Normal | C-90/20/65 | 0.012 |
| | Treated | C-90/20/65 + D-48/50 | 0.016 |
| Triclene resistance | | A | No change |

For comparison, when a one-surface copper-clad laminate was prepared by the same manner except that a commercial epoxy resin prepreg (having a glass cloth as a base material and a resin content of 56 % by weight) was used instead of the prepreg (J), there occurred delamination between the diallyl phthalate resin layer and epoxy resin layer and it could not be put into practical uses.

EXAMPLE 6

A paper sheet (thickness 8 mils) was dipped in and impregnated with a varnish consisting of 95 parts by weight of a diallyl phthalate prepolymer, 5 parts by weight of a diallyl phthalate monomer, 2 parts by weight of tert-butyl perbenzoate, 0.4 part by weight of benzoyl peroxide and 140 parts by weight of acetone. The impregnated sheet was dried at 90°C. for 10 minutes and at 135°C. for 4 minutes to obtain a prepreg having a resin content of 49 % by weight.

On the other hand, a copper foil (thickness 35 microns) was spray-coated with the epoxy resin varnish of Example 5 and dried to obtain a copper foil having an adhesive layer (average thickness 35 microns).

Then eight sheets of the above prepared prepregs were stacked. Then on each surface, the above mentioned copper foil was placed, and the assembly was heated at 155°C. under a pressure of 130 kg./cm² for 90 minutes to obtain a unitary laminate clad with copper on both surfaces. For this laminate no change was observed in the solder-resistance test (at 260°C. for 10 seconds) and the peeling strength was 1.5 kg./cm².

For comparison a both-surface copper-clad laminate was prepared in the same manner except that the copper foils were not coated with the varnish of this invention. This laminate was blistered in the solder-resistance test (at 260°C. for 10 seconds) and its peeling strength was less than 0.5 kg./cm².

EXAMPLE 7

A glass mat (300 g./m.²) was impregnated with a varnish consisting of 98 parts by weight of a diallyl phthalate prepolymer, 2 parts by weight of a diallyl phthalate monomer, 50 parts by weight of tert-butyl perbenzoate, 50 parts by weight of acetone and 150 parts by weight of toluene. The impregnated mat was dried at 90° to 125°C. for 20 minutes to obtain a prepreg (K) having a resin content for 62 % by weight.

On the other hand, a glass cloth (95 g./m.², 1 mm. thick) was impregnated with a varnish consisting of 100 parts by weight of an epoxy resin (Dow 511), 36 parts by weight of a curing agent of the formula [VI] and 140 parts by weight of methyl ethyl ketone. The impregnated cloth was dried at 80° to 130°C. for 15 minutes to obtain a prepreg (L) having a resin content of 56 % by weight.

Then two of the above prepared prepregs (K), one sheet of the prepreg (L) and a copper foil (thickness 5 microns) were stacked in the mentioned order. The assembly was heated at 160°C. under a pressure of 40 kg./cm.$^2$ for 60 minutes to obtain a one-surface copper-clad laminate having the following characteristics:

| | |
|---|---|
| Peeling strength after the soldering: | 1.5 kg./cm.$^2$ |
| Dielectric constant (IMH$_z$) after the treatment: | 4.3 |
| Dielectric dissipation factor (IMH$_z$) after the treatment: | 0.016 |

For comparison, a one-surface copper-clad laminate was prepared in the same manner except that a commercial epoxy resin prepreg (glass cloth base material, resin content 56 % by weight) was used instead of the prepreg (L). There occurred delamination between the diallyl phthalate resin layer and the epoxy resin layer and the laminate could not be put into practical uses.

EXAMPLE 8

A copper foil (thickness of 35 microns) was coated with a varnish consisting of 85 parts by weight of an epoxy resin (Araldite 6071), 15 parts by weight of another epoxy resin (Araldite GY-250), 30 parts by weight of a curing agent of the formula [IV] and 150 parts by weight of acetone. The coated foil was dried at 80° to 135°C. for 20 minutes to obtain a copper foil with an adhesive layer having an average thickness of 50 microns.

Then six of the prepregs (I) of Example 5 and the above prepared copper foil were stacked. The assembly was heated at 175°C. under a pressure of 100 kg./cm.$^2$ for 90 minutes to obtain a one-surface copper-clad laminate of a thickness of 1.05 mm.

This one-surface copper-clad laminate was not changed in the solder-resistance test (at 260°C. for 20 seconds) and the peeling strength was 1.55 kg./cm.$^2$ For comparison, a one-surface copper-clad laminate was prepared in the same manner except that a commercial copper foil (foil thickness 35 microns) with an epoxy resin adhesive (thickness 50 microns) was used instead of the copper-foil of the above example. The copper foil on the surface was easily delaminated and therefore the laminate could not be applied to practical uses.

EXAMPLE 9

1 mol of isophthalic acid and 2.1 mols of propylene glycol were reacted at 180° to 220°C. in a carbon dioxide gas current to obtain a condensation product having an acid value of 8.8. Then 60 mg. of hydroquinone and 1 mol of maleic anhydride were added thereto to further react at 180° to 235°C. to obtain an unsaturated polyester having an acid value of 25.4 and a melting point of 75° to 78°C.

A glass cloth (0.18 mm. thick, 205 g./m.$^2$) was dipped in and impregnated with a resin varnish consisting of 75 parts by weight of the above prepared unsaturated polyester, 25 parts by weight of a diallyl phthalate prepolymer (melting point 80°C.), 1.2 parts by weight of tert-butyl perbenzoate and 80 parts by weight of toluene. The impregnated cloth was then dried at 90° to 130°C. for 15 minutes to obtain a prepreg having a resin content of 43 % by weight which was not sticky.

On the other hand, a copper foil (thickness 35 microns) was spray-coated with a resin varnish consisting of 75 parts by weight of an epoxy resin (Araldite 6071), 25 parts by weight of another epoxy resin (Araldite GY-250), 20 parts by weight of the partially esterified aromatic polycarboxylic acid of the formula (C) and 100 parts by weight of acetone. The coated foil was dried at 70°C. for 10 minutes and at 125°C. for 6 minutes to obtain a copper foil with an adhesive layer having an average thickness of 35 microns.

Then, nine sheets of the above prepared prepregs and one copper foil were laminated and the assembly was heated at 175°C. under a pressure of 70 kg./cm.$^2$ for 60 minutes to obtain a unitary laminate clad with copper on one surface. The characteristics of this laminate area shown in Table 5.

Table 5

| Item | | Treatment | Example 9 |
|---|---|---|---|
| Solder resistance (260°C. 30 sec.) | | A | No change |
| Peeling strength (kg./cm.) | Normal | A | 1.6 |
| | Treated | | 1.6 |
| Volume resistivity (Ω- cm.) | Normal | C-90/20/65 | 5 × 10$^{13}$ |
| | Treated | C-90/20/65 + C-96/40/90 | 1 × 10$^{13}$ |
| Adhesive surface resistance (Ω) | Normal | C-90/20/65 | 3 × 10$^{13}$ |
| | Treated | C-90/20/65 + C-96/40/90 | 3 × 10$^{11}$ |
| Laminate surface resistance (Ω) | Normal | C-90/20/65 | 4 × 10$^{13}$ |
| | Treated | C-90/20/65 + C-96/40/90 | 3 × 10$^{11}$ |
| Insulation resistance (Ω) | Normal | C-90/20/65 | 3 × 10$^{13}$ |
| | Treated | C-90/20/65 + D-2/100 | 2 × 10$^{10}$ |
| Dielectric constant (IMH$_z$) | Normal | C-90/20/65 | 4.2 |
| | Treated | C-90/20/65 + D-48/590 | 4.4 |
| Dielectric dissipation factor (IMH$_z$) | Normal | C-90/20/65 | 0.011 |
| | Treated | C-90/20/65 + D-48/50 | 0.015 |
| Triclene resistance | | A | No change |

For comparison, the same procedure was repeated except that a commercial copper foil (CFC-J) with an epoxy resin adhesive was employed. The resulting laminate blistered in the solder-resistance test (at 260°C. for 15 seconds) and the peeling strength after the soldering could not be measured.

EXAMPLE 10

1.2 mols of maleic anhydride, 0.8 mol of HET acid (product of Hooker Chemical Company), 2.1 mols of propylene glycol and 85 mg. of hydroquinone were reacted to obtain an unsaturated polyester having an acid value of 20.9 and a melting point of 73° to 76°C.

A chopped strand glass mat (310 g./m.$^2$) was sprinkled with a resin varnish consisting of 95 parts by weight of the above prepared unsaturated polyester, 5 parts by weight of a compound (m.p. 78°C.) of the following formula:

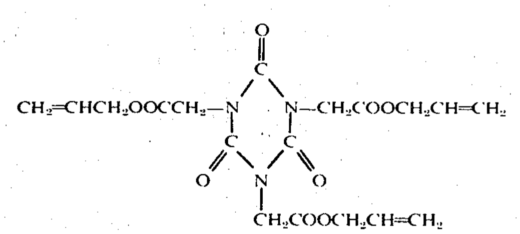

1 part by weight of tert-butyl perbenzoate, 30 parts by weight of acetone and 70 parts by weight of toluene. The varnish-impregnated mat was dried at 80°C. for 30 minutes and then at 120°C. for 15 minutes to obtain a prepreg having a resin content of 63 % by weight.

On the other hand, a copper foil (thickness 35 microns) was coated with a resin varnish consisting of 90 parts by weight of an epoxy resin (Dow 511), 10 parts by weight of another epoxy resin (Araldite 6071), 27 parts by weight of the partially esterified aromatic polycarboxylic acid of the formula (D), 60 parts by weight of methyl ethyl ketone and 15 parts by weight of cellosolve. The coated foil was dried at 80° to 135°C. for 18 minutes to obtain a copper foil with an adhesive layer (thickness 60 microns).

Then three sheets of the above prepared prepregs were stacked and then on each face one of the above copper foil was placed. Then the assembly was heated at 160°C. under a pressure of 30 kg./cm.$^2$ for 90 minutes to obtain a both-surface copper-clad laminate having a thickness of 2.0 mm. The characteristics of this laminate are as shown in Table 6.

Table 6

| Item | | Example 10 |
|---|---|---|
| Solder resistance (260°C., 30 Sec.) | | No change |
| Peeling strength (kg./cm.) | Normal | 1.5 |
| | Solder treated | 1.5 |
| Dielectric constant (IMH$_z$) | Normal | 4.0 |
| | Treated | 4.2 |
| Dielectric dissipation factor (IMH$_z$) | Normal | 0.011 |
| | Treated | 0.015 |
| Inflammability ASTM D635 | | Self-extinguished in 5 sec. |

For comparison, the same procedure was repeated except that a commercial copper foil (foil thickness of 35 microns) with an epoxy resin adhesive (thickness 50 microns) (CR-T produced by Fukuda Metal Co.) was used instead of the above mentioned copper foil of this invention. When the peeling strength of the resulting copper-clad laminate was measured, the copper foil was readily delaminated.

EXAMPLE 11

0.5 mol of isophthalic acid, 0.5 mol of phthalic anhydride and 2.1 mols of propylene glycol were reacted until the acid value of the condensation product became 7.6 and then the polycondensation reaction was further continued by adding 1 mol of maleic anhydride and 80 mg. of hydroquinone to obtain an unsaturated polyester having an acid value of 26.6 and a melting point of 62° to 65°C.

A paper sheet (thickness 8 mils) was dipped in and impregnated with a resin varnish consisting of 94 parts by weight of the above unsaturated polyester, 6 parts by weight of acrylamide, 0.8 part by weight of tert-butyl perbenzoate, 0.2 part by weight of benzoyl peroxide and 100 parts by weight of acetone. The impregnated paper sheet was dried at 100° to 120°C. for 10 minutes to obtain a prepreg having a resin content of 49 % by weight.

On the other hand, a copper foil (thickness 35 microns) was spray-coated with a resin varnish consisting of 80 parts by weight of an epoxy resin (Araldite 6071), 20 parts by weight of another epoxy resin (Araldite GY-250), 15 parts by weight of the partially esterified aromatic polycarboxylic acid of the formula (E) and 150 parts by weight of acetone. The coated foil was dried at 80°C. for 5 minutes and at 120°C. for 8 minutes to obtain a copper foil with an adhesive layer having an average thickness of 40 microns.

Then, nine sheets of the above prepared prepregs and one copper foil were laminated and the assembly was heated at 153°C. under a pressure of 120 kg./cm.$^2$ for 90 minutes to obtain a unitary laminate clad with copper on one surface.

When the characteristics of this copper-clad laminate were measured by the methods specified under JIS C6482, no change was observed in solder resistance test (at 260°C. for 20 seconds) and the peeling strength after the soldering was 1.5 kg./cm.$^2$

EXAMPLE 12

1.35 mols of maleic anhydride, 0.65 mol of HET acid (product of Hooker Chemical Company), 2.10 mols of propylene gylcol and 80 mg. of hydroquinone were polycondensed to obtain an unsaturated polyester having an acid value of 21.9 and a melting point of 68° to 73°C.

A glass cloth (0.18 mm. thick, 202 g./m.$^2$) was dipped in and impregnated with a resin varnish consisting of 75 parts by weight of the above prepared unsaturated polyester, 25 parts by weight of a diallyl phthalate prepolymer (product of Daiso Chemical Co.), 5 parts by weight of antimony oxide, 1 part by weight of tert-butyl perbenzoate, 30 parts by weight of acetone and 45 parts by weight of toluene. The impregnated cloth was dried at 120° to 130°C. for 15 minutes to obtain a prepreg (M) of a resin content of 40 % by weight.

On the other hand, a glass cloth (0.1 mm. thick, 90 g./m.$^2$) was dipped in and impregnated with a resin varnish consisting of 90 parts by weight of an epoxy resin (Dow 511), 10 parts by weight of another epoxy resin (Araldite 6071), 27 parts by weight of the partially esterified aromatic polycarboxylic acid of the formula (A), 60 parts by weight of methyl ethyl ketone and 15 parts by weight of methyl cellosolve. The impregnated cloth was dried at 100° to 110°C. for 10 minutes to obtain a prepreg (N) of a resin content of 52 % by weight.

Then, seven sheets of the above prepregs (M) were laminated. Then one prepreg (N) was laminated on each surface and one copper foil (thickness 35 microns) was placed on each surface of the laminate. Then the assembly was heated at 165°C. under a pressure of 75 kg./cm.$^2$ for 80 minutes to obtain a unitary laminate clad with copper on both surfaces. The characteristics of the laminate thus obtained are as shown in Table 7.

For comparison, the characteristics of a both-surface copper-clad laminate prepared in the same manner except that the prepreg (N) in the above mentioned example was not used are also given in the table.

Table 7

| Item | | Example 12 | Control |
|---|---|---|---|
| Solder resistance (260°C., 30 sec.) | | No change | Blistered |
| Peeling strength (kg./cm.) | Normal | 1.55 | 1.04 |
| | Solder treated | 1.52 | Blistered |
| Dielectric constant (IMH$_z$) | Normal | 4.3 | 4.3 |
| | Treated | 4.4 | 4.4 |
| Dielectric dissipation factor (IMH$_z$) | Normal | 0.010 | 0.013 |
| | Treated | 0.014 | 0.014 |
| Inflammability ASTM D635 | | Self-extinguished in 5 sec. | Self-extinguished in 5 sec. |

EXAMPLE 13

A glass cloth (95 g./m.$^2$, 0.1 mm. thick) was dipped in and impregnated with a resin varnish consisting of 100 parts by weight of a diallyl phthalate prepolymer, 1.5 parts by weight of tert-butyl perbenzoate and 70 parts by weight of methyl ethyl ketone. The impregnated cloth was dried at 90°C. for 10 minutes and at 130°C. for 6 minutes to obtain a prepreg (0) of a resin content of 62 % by weight. In the same manner, a glass cloth (205 g./m.$^2$, 0.18 mm. thick) was dipped in and impregnated with the above mentioned resin varnish and was dried to obtain a prepreg (P) having a resin content of 40 % by weight.

On the other hand, a copper foil (thickness 35 microns) was spray-coated with a resin varnish consisting of 80 parts by weight of an epoxy resin (Araldite 6071), 20 parts by weight of another epoxy resin (Araldite GY-250), 20 parts by weight of the partially esterified aromatic polycarboxylic acid of the formula (C) and 150 parts by weight of acetone. The coated foil was dried at 70°C. for 10 minutes and at 125°C. for 6 minutes to obtain a copper foil with an adhesive having an average thickness of 40 microns.

Then eight of the above prepared prepregs (0) were stacked and on one side one prepreg (P) and one copper foil were placed and the assembly was heated at 175°C. under a pressure of 60 kg./cm.$^2$ for 80 minutes to obtain a unitary laminate clad with copper on one surface. The characteristics of such laminate are as shown in Table 8.

Table 8

| Item | | Treatment | Example 13 |
|---|---|---|---|
| Solder resistance (260°C., 30 sec.) | | A | No change |
| Peeling strength (kg./cm.) | Normal | A | 1.5 |
| | Treated | | 1.5 |
| Volume resistivity | Normal | C-90/20/65 | 5 × 10$^{13}$ |

Table 8-Continued

| Item | | Treatment | Example 13 |
|---|---|---|---|
| (Ω - cm.) | Treated | C-90/20/65 + C-96/40/90 | 3 × 10$^{13}$ |
| Adhesive surface resistance (Ω) | Normal | C-90/20/65 | 2 × 10$^{13}$ |
| | Treated | C-90/20/65 + C-96/40/90 | 2 × 10$^{11}$ |
| Laminate surface resistance (Ω) | Normal | C-90/20/65 | 6 × 10$^{13}$ |
| | Treated | C-90/20/65 + C-96/40/90 | 4 × 10$^{11}$ |
| Insulation resistance (Ω) | Normal | C-90/20/65 | 3 × 10$^{13}$ |
| | Treated | C-90/20/65 + D-2/100 | 4 × 10$^{10}$ |
| Dielectric constant (IMH$_z$) | Normal | C-90/20/65 | 4.3 |
| | Treated | C-90/20/65 + D-48/590 | 4.5 |
| Dielectric dissipation factor (IMH$_z$) | Normal | C-90/20/65 | 0.010 |
| | Treated | C-90/20/65 + D-48/50 | 0.015 |
| Triclene resistance | | A | No change |

For comparison, a one-surface copper-clad laminate was prepared in the same manner as above except that a commercial copper foil (CFC-J) with an epoxy resin binder was used. The laminate blistered in the solder-resistance test (at 260°C. for 15 seconds) and the peeling strength after the soldering could not be measured.

EXAMPLE 14

A paper sheet (thickness 8 mils) was dipped in and impregnated with a resin varnish consisting of 95 parts by weight of a diallyl phthalate prepolymer, 5 parts by weight of diallyl phthalate monomer, 2 parts by weight of tert-butyl perbenzoate, 0.4 part by weight of benzoyl peroxide and 140 parts by weight of acetone. The impregnated sheet was dried at 90°C. for 10 minutes and at 130°C. for 5 minutes to obtain a prepreg having a resin content of 52 % by weight.

On the other hand, a copper foil (thickness 35 microns) was coated with a resin varnish consisting of 100 parts by weight of an epoxy resin (Dow 511), 30 parts by weight of the partially esterified aromatic polycarboxylic acid of the formula [I] and 120 parts by weight of methyl ethyl ketone and the coated foil was dried at 80° to 135°C. for 18 minutes to obtain a copper foil with an adhesive layer having a thickness of 65 microns.

Then, nine of the above prepared prepregs were laminated and one copper foil was placed on each side of the laminate. The laminate was heated at 155°C. under a pressure of 120 kg./cm.$^2$ for 90 minutes to obtain a both-surface copper-clad laminate having a thickness of 1.85 mm. When the characteristics of this both-surface copper-clad laminate were measured by the testing methods specified under JIS C6482, no change was observed in the solder-resistance test (at 260°C. for 10 seconds) and the peeling strength after the soldering was 1.5 kg./cm.

For comparison, a both-surface copper-clad laminate prepared in the same manner except that the copper foils were not coated with the resin varnish. This laminate had a peeling strength of less than 0.5 kg./cm.$^2$ in the normal state and blistered in the solder-resistance test (at 260°C. for 10 seconds).

EXAMPLE 15

A glass mat (310 g./m.$^2$) was sprinkled with the varnish of Example 13 and dried at 90°C. for 20 minutes and at 125°C. for 6 minutes to obtain a prepreg having a resin content of 62 % by weight.

On the other hand, a copper foil (thickness 35 microls) was spray-coated with a resin varnish consisting of 100 parts by weight of an epoxy resin (Araldite 6071), 15 parts by weight of the described partially esterified aromatic polycarboxylic acid of the formula (E) and 200 parts by weight of methyl ethyl ketone. The coated foil was dried at 80°C. for 25 minutes and at 120°C. for 8 minutes to obtain a copper foil with an adhesive layer of an average film thickness of 28 microns.

Then, two of the above prepared prepregs, one prepreg obtained in Example 13 and one copper foil were stacked in the mentioned order. The assembly was heated at 150°C. under a pressure of 40 kg./cm.$^2$ for 60 minutes to obtain a unitary laminate clad with copper foil on one surface. The characteristics of this laminate are as shown in Table 9.

Table 9

| Item | | Example 15 |
|---|---|---|
| Solder resistance (260°C., 20 sec.) | | No change |
| Peeling strength (kg./cm.) | Normal | 1.5 |
| | Solder treated | 1.5 |
| Dielectric-constant (IMH$_z$) | Normal | 4.1 |
| | Treated | 4.3 |
| Dielectric dissipation factor (IMH$_z$) | Normal | 0.012 |
| | Treated | 0.016 |

For comparison, a one-surface copper-clad laminate was prepared in the same manner as above except that a commercial copper foil (foil thickness 35 microns) with an epoxy resin adhesive layer (thickness 32 microns) was used. This laminate had a peeling strength of 1.6 kg./cm.$^2$ in the normal state but blistered in the solder-resistance test (at 260°C. for 20 seconds).

EXAMPLE 16

A paper sheet (thickness 9 mils) impregnated with 13 % by weight of melamine resin was dipped in and impregnated with a resin varnish consisting of 95 parts by weight of a diallyl phthalate prepolymer, 5 parts by weight of a diallyl phthalate monomer, 2 parts by weight of tert-butyl perbenzoate, 0.5 part by weight of benzoyl peroxide and 100 parts by weight of acetone, and was dried at 90°C. for 10 minutes and and at 130°C. for 5 minutes to obtain a prepreg (Q) of a resin content of 48 % by weight.

On the other hand, a kraft paper sheet (thickness 8 mils) was dipped in and impregnated with a resin varnish consisting of 90 parts by weight of an epoxy resin (Dow 511), 10 parts by weight of another epoxy resin (Araldite 6071), 28 parts by weight of the partially esterified aromatic polycarboxylic acid of the formula (A), 60 parts by weight of methyl ethyl ketone and 10 parts by weight of methyl cellosolve and was dried at 130°C. for 10 minutes to obtain a prepreg (R) of a resin content of 52 % by weight.

Then, nine of the above prepared prepregs (Q) were laminated. Further one prepreg (R) and one copper foil (thickness 35 microns) were laminated thereon and the assembly was heated at 160°C. under a pressure of 120 kg./cm.$^2$ for 90 minutes to obtain a unitary laminate clad with copper on one surface. The characteristics of this laminate are as shown in Table 10.

For comparison, there are also indicated the characteristics of a one-surface copper-clad laminate prepared in the same manner as above except that the prepreg (R) was not used.

Table 10

| Item | | Example 16 | Control |
|---|---|---|---|
| Solder resistance (260°C., 20 sec.) | | No change | Blistered |
| Peeling strength (kg./cm.) | Normal | 1.5 | 0.9 |
| | Solder treated | 1.5 | Blistered |
| Insulation resistance (Ω) | Normal | $4 \times 10^{12}$ | $4 \times 10^{12}$ |
| | Treated | $6 \times 10^{9}$ | $7 \times 10^{9}$ |

What we claim is:

1. A method for preparing a copper-clad laminate which comprises impregnating a base sheet with a varnish containing (1) a thermosetting resinous material selected from the group consisting of prepolymers of unsaturated polyesters and prepolymers of polydiallylphthalates and (2) a polymerization initiator, the varnish also containing a cross-linking agent when the resinous material is a prepolymer of an unsaturated polyester, drying the impregnated sheet, placing a copper foil on the surface of the dried sheet through a layer of a thermosetting adhesive containing (1) a curable epoxy resin and (2) a curing agent selected from the group consisting of (a) compounds having at least one amino or imino radical and at least one allyl or vinyl radical and (b) aromatic polycarboxylic acids partially esterified with an unsaturated compound having at least one allyl, substituted allyl, vinyl or substituted vinyl radical, and heating the assembly under pressure to form a unitary structure.

2. A method according to claim 1 wherein the varnish contains an unsaturated polyester prepolymer having a melting point higher than 40°C. and a cross-linking agent having a melting point higher than 40°C.

3. A method according to claim 1 wherein the curing agent (a) is selected from the group consisting of compounds of $$CH_2=CH-CH_2NH_2,$$

$$CH_2=C(CH_3)-CH_2NH_2,$$

$$CH_2=CHCH_2CONH_2,$$

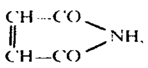

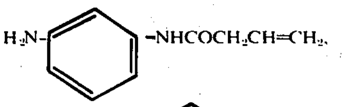

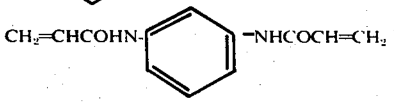

and

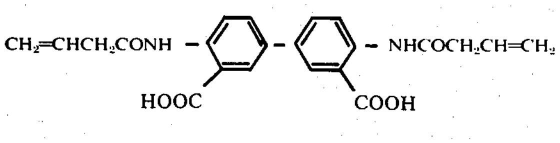

4. A method according to claim 1, wherein the curing agent (b) is selected from the group consisting of compounds of the formulae

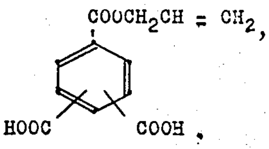

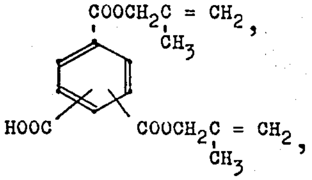

AND

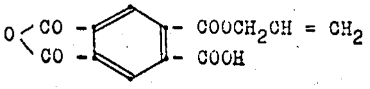

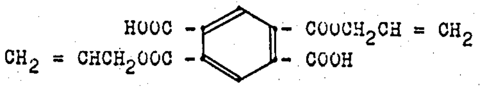

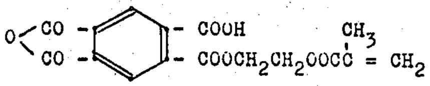

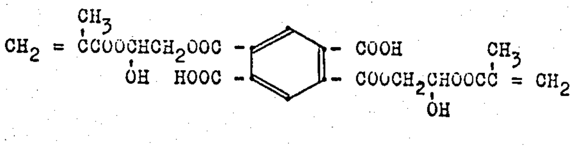

5. A method according to claim 1 wherein the curing agent is used in an amount of 5–40 parts by weight per 100 parts by weight of the epoxy resin.

6. A method according to claim 5 wherein a varnish containing the epoxy resin and curing agent is applied on the surface of the copper foil, which is then dried and placed on the base sheet.

7. A method according to claim 5 wherein a varnish containing the epoxy resin and curing agent is impregnated into a fibrous sheet material, which is then dried and placed between the copper foil and the base sheet.

* * * * *